United States Patent
Choi et al.

(10) Patent No.: US 10,078,111 B2
(45) Date of Patent: Sep. 18, 2018

(54) HANDLER AND MANAGEMENT METHOD THEREOF

(71) Applicant: SAMSUNG ELECTRONICS CO., LTD., Suwon-si, Gyeonggi-do (KR)

(72) Inventors: Guiheum Choi, Asan-si (KR); Hogyung Kim, Cheonan-si (KR); Younggil Lee, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 360 days.

(21) Appl. No.: 14/828,755

(22) Filed: Aug. 18, 2015

(65) Prior Publication Data

US 2016/0084904 A1 Mar. 24, 2016

(30) Foreign Application Priority Data

Sep. 18, 2014 (KR) .................. 10-2014-0124421

(51) Int. Cl.
  *G01R 31/28* (2006.01)
  *G01R 1/04* (2006.01)
(52) U.S. Cl.
  CPC ....... *G01R 31/2893* (2013.01); *G01R 1/0466* (2013.01)
(58) Field of Classification Search
  CPC .. G01R 1/04–1/0491; G01R 31/2851–31/2893
  USPC ...................................... 324/750.01–759.03
  See application file for complete search history.

(56) References Cited

U.S. PATENT DOCUMENTS

| 6,433,564 | B1* | 8/2002 | Shekar ............... G01R 1/0483 324/750.05 |
| 6,739,894 | B2 | 5/2004 | Ogura |
| 7,619,432 | B2 | 11/2009 | Roberts |
| 7,633,304 | B2* | 12/2009 | Schaule ............ G01R 31/2881 324/750.01 |
| 2012/0299614 | A1 | 11/2012 | Wu |
| 2013/0181733 | A1* | 7/2013 | Kikuchi .............. G01R 1/0466 324/750.03 |

FOREIGN PATENT DOCUMENTS

| JP | 09-061489 A | 3/1997 |
| JP | 2003-004802 A | 1/2003 |
| JP | 2008-256678 A | 10/2008 |
| JP | 2009-139158 A | 6/2009 |
| JP | 2009-198375 A | 9/2009 |
| JP | 2010-202392 A | 9/2010 |
| KR | 10-2005-0087301 A | 8/2005 |

OTHER PUBLICATIONS

Fumitake; Translation of Japanese Patent Document JP2010202392 A; Sep. 16, 2010; EPO & Google.*
Iwamoto et al.; Translation of Japanese Patent Document JP2009139158 A; Jun. 25, 2009; EPO & Google.*

* cited by examiner

*Primary Examiner* — Melissa Koval
*Assistant Examiner* — Rahul Maini
(74) *Attorney, Agent, or Firm* — Lee & Morse, P.C.

(57) ABSTRACT

A handler includes a loading unit transporting substrates and sockets coupled to the substrates, a test unit including a printed circuit board, the sockets being mounted on the printed circuit board, and latches fixing the sockets to the printed circuit board, and an unloading unit unloading the substrates and the sockets from the test unit.

15 Claims, 7 Drawing Sheets

HANDLER AND MANAGEMENT METHOD THEREOF

CROSS-REFERENCE TO RELATED APPLICATION

Korean Patent Application No. 10-2014-0124421, filed on Sep. 18, 2014, in the Korean Intellectual Property Office, and entitled: "Handler and Management Method Thereof," is incorporated by reference herein in its entirety.

BACKGROUND

1. Field

The present disclosure herein relates to a semiconductor manufacturing apparatus, and more particularly, to a handler performing a test process and a management method thereof.

2. Description of the Related Art

With the recent developments of information communication, various kinds of semiconductor apparatuses are being researched and developed. A semiconductor apparatus is required to ensure reliability as well as performance thereof. A test process may evaluate the reliability of the semiconductor apparatus. The test process may be performed mainly by a handler.

SUMMARY

The present disclosure provides a handler capable of automatically replacing sockets on which substrates are mounted and a management method thereof.

The present disclosure also provides a handler capable of fixing sockets on a printed circuit board and a management method thereof.

Embodiments provide a handler including a loading unit transporting substrates and sockets coupled to the substrates, a test unit including a printed circuit board the sockets being mounted on the printed circuit board, and latches fixing the sockets to the printed circuit board, and an unloading unit unloading the substrates and the sockets from the test unit.

The test unit may further include a mount guide including a docking plate on the printed circuit board, the docking plate exposing a part of the printed circuit board, and socket housings in the docking plate, the socket housings fixing the sockets, and the latches being on the socket housings.

The latches may include latch plates extended from the docking plate toward the sockets inside the socket housings; and cylinders moving the latch plates from outside of the sockets toward a top portion of the sockets along the docking plate.

The sockets may include sheet sockets connected to the printed circuit board, and socket inserts surrounding the sheet sockets, guide pins of the socket housings being inserted into edges of the socket inserts to align the sheet sockets on the printed circuit board.

The latches may be on a back surface of the docking plate.

The latch plates may be on two sides of the socket housings, respectively, the latch plates being coupled to the sockets when coming close to each other, and decoupled from the sockets when going away from each other.

The latches may include shafts on the socket housings, and latch pins rotated from the socket housings toward the sockets along the shaft to fix the sockets.

The loading unit and the unloading unit may respectively include shuttles transporting the substrates and the sockets, the shuttles including double pockets for mounting the substrates and the sockets.

The double pockets may include lower pockets in which the substrates are mounted, and upper pockets wider than the lower pockets, the sockets being mounted in the upper pockets.

The test unit may further include contact control modules moving the substrates between the sockets on the printed circuit board and the shuttles, and delivering the sockets between the shuttles and the printed circuit board.

Each of the loading unit and the unloading unit may include first and second socket storage buffers storing the sockets, the first socket storage buffer storing new sockets, and the second socket storage buffer storing waste sockets.

Embodiments also provide a method of managing a handler, the method including testing substrates, determining whether to temporarily stop the testing of the substrates, and replacing the sockets when the testing of the substrates is temporarily stopped, replacing of the sockets including unloading waste sockets from the printed circuit board, loading new sockets on the printed circuit board, and fixing the new sockets onto the printed circuit board with latches.

Testing the substrates may include loading the substrates to a test unit from a loading unit, testing the substrates in the test unit, and unloading the substrates from the test unit to an unloading unit, wherein the waste sockets are unloaded to the unloading unit and the new sockets are provided to the test unit from the loading unit.

The test unit may include contact control modules providing the substrates and the sockets to the printed circuit board and unloading the substrates and the sockets from the printed circuit board, the loading unit and the unloading unit may include shuttles transporting the substrates and the sockets, and the sockets may be delivered between the contact control modules and the shuttles.

Determining of whether to temporarily stop the test may include checking failures of the sockets according to contact failures or short circuits of the substrates and the sockets.

Embodiments also include a loading unit transporting substrates and sockets coupled to the substrates, a test unit including a printed circuit board, the sockets being mounted on the printed circuit board, and latches on the printed circuit board, the latches being movable on the printed circuit board toward the sockets to detachably affix the sockets to the printed circuit board, and an unloading unit unloading the substrates and the sockets from the test unit.

The latches may be movable to partially cover edges of the sockets to affix the sockets to the printed circuit board.

The test unit may further include socket housings on the printed circuit board, the latches being movable toward the socket housings to extend beyond edges of the socket housings.

The latches may include latch plates linearly extended along a first direction parallel to a row of the socket housings, the latch plates being movable along a second direction toward the row of the socket housings, and cylinders moving the latch plates along the second direction, the second direction being perpendicular to the first direction.

The latches may be movable toward the socket housings to partially cover openings in respective socket housings, the openings accommodating the sockets.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
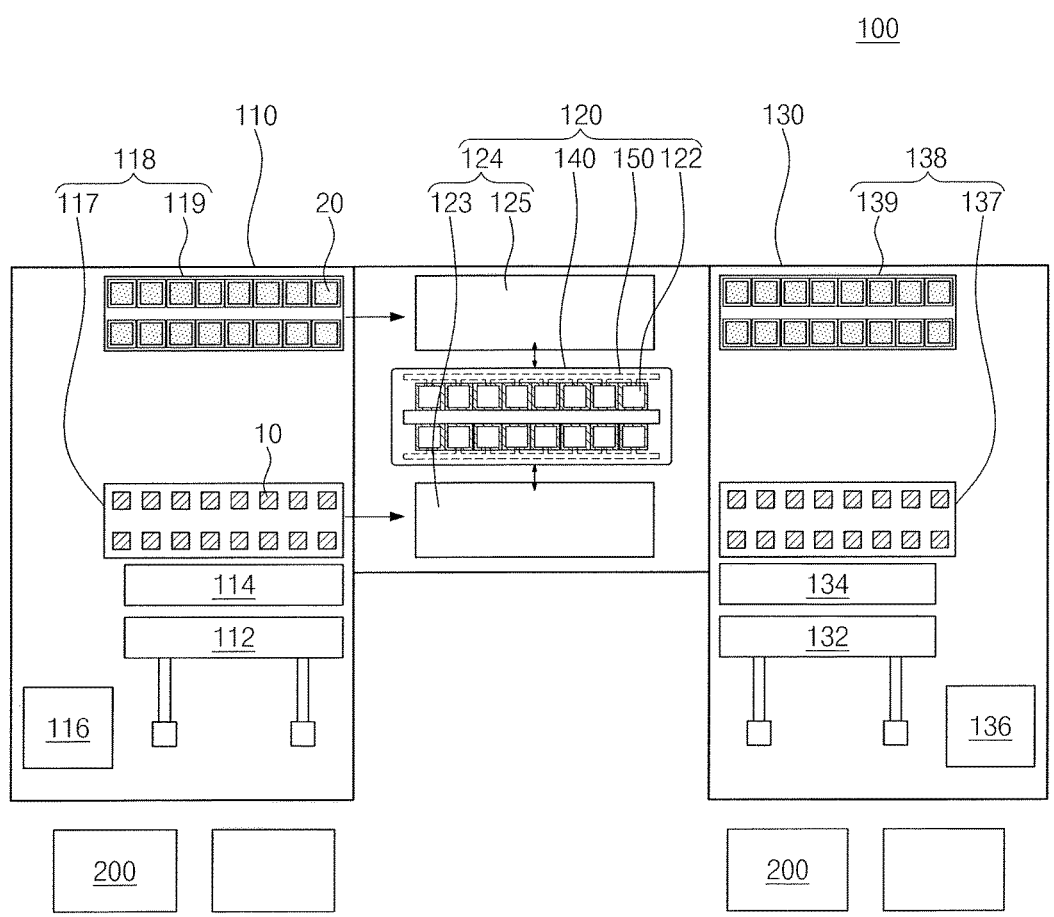
FIG. 1 illustrates a schematic view of a handler according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terms and words used in the following description and claims are to describe embodiments but are not limited. As used herein, the singular forms "a," "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements. In addition, as just exemplary embodiments, reference numerals shown according to an order of description are not limited to the order.

Hereinafter, exemplary embodiments will be described in detail with reference to the accompanying drawings.

FIG. 1 illustrates a handler 100 according to an embodiment. The handler 100 may primarily include a loading unit 110, a test unit 120, and an unloading unit 130. The loading unit 110 may provide substrates 10 and sockets 20 to the test unit 120. The test unit 120 may electrically test the substrates 10. The test unit 120 may automatically replace the sockets 20. The loading unit 130 may unload the substrates 10 and the sockets 20 from the test unit 120. The test unit 120 may be disposed between the loading unit 110 and the unloading unit 130.

The loading unit 110 may be disposed between stackers 200 and the test unit 120. The loading unit 110 may deliver substrates 10 from the stackers 200 to the test unit 120. The loading unit 110 may provide the sockets 20 to the test unit 120. The sockets 20 may be new products. According to an example, the loading unit 110 may include an input module 112, a loading buffer 114, a first socket storage buffer 116, and loading shuttles 118.

The input module 112 may pick up the substrates 10 from the stackers 200. The stackers 200 may store the substrates 10. The substrates 10 may be delivered to the loading buffer 114 by the input module 112. The input module 112 may pick up the sockets 20 from the first socket storage butter 116. The first socket storage buffer 116 may store new sockets 20. The sockets 20 may be provided to the loading buffer 114. The loading buffer 114 may temporarily store the substrates 10 and the sockets 20. The substrates 10 and the sockets 20 in the loading buffer 114 may be provided to the loading shuttles 118 by robots (not shown).

The loading shuttles 118 may provide the substrates 10 and the sockets 20 to the test unit 120. According to an example, the loading shuttles 118 may include a first loading shuttle 117 and a second loading shuttle 119. The first and second loading shuttles 117 and 119 may transport the substrates 10. The sockets 20 may be transported by any one of the first and second loading shuttles 117 and 119.

Figure 2:
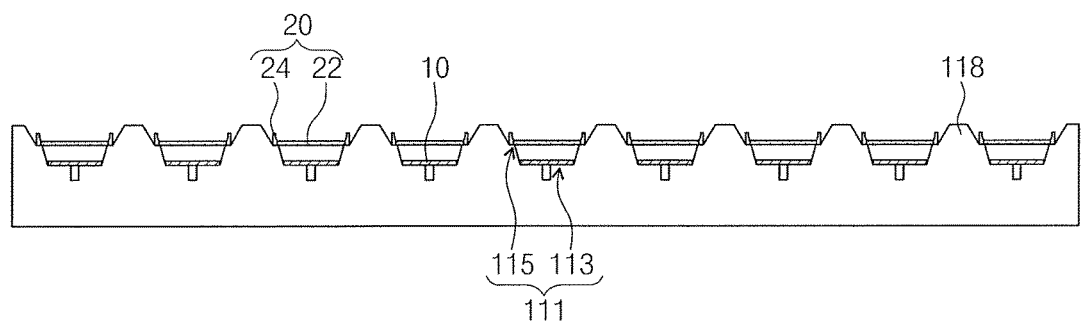
FIG. 2 illustrates a cross-sectional view of loading shuttles in FIG. 1.

FIG. 2 illustrates a cross section of the loading shuttles 118 of FIG. 1. The loading shuttles 118 may simultaneously transport the substrates 10 and the sockets 20. According to an example, the loading shuttles 118 may have double pockets 111. Each of the double pockets 111 may include a lower pocket 113 and an upper pocket 115. The lower pocket 113 may be smaller, e.g., having a smaller width, than the upper pocket 115. The lower pockets 113 may mount the substrates 10 thereon. The upper pocket 115 may be disposed over the lower pocket 113. The upper pockets 115 may mount the sockets 20 thereon. The substrates 10 and the sockets 20 may be overlapped in the double pockets 111. However, embodiments are not limited to the above-described example, e.g., the loading shuttles 118 may individually transport the substrates 10 and the sockets 20.

Figure 4:
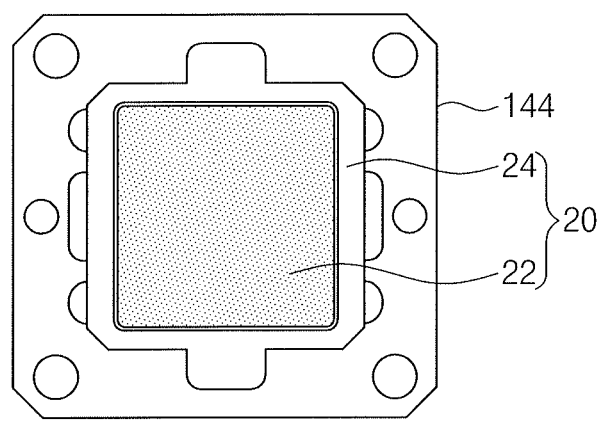
FIGS. 4 and 5 illustrate a plan view and a cross-sectional view, respectively, of a socket coupled into a socket housing of FIG. 3.

The sockets 20 may include sheet sockets 22 and socket inserts 24. For example, each of the sheet sockets 22 may include a rubber socket, and the socket inserts 24 may fix edges of the sheet sockets 22, as will be described in more detail below with reference to FIGS. 4-5. Furthermore, the socket inserts 24 may surround the sheet sockets 22, as illustrated in FIG. 4. The sheet sockets 22 may be smoothly fixed.

Referring to FIG. 1 again, the loading unit 110 and the unloading unit 130 may be symmetrically disposed on both, e.g., opposite, sides of the test unit 120. The unloading unit 130 may unload the substrates 10 and the sockets 20 from the test unit 120, e.g., the unloaded substrates 10 may be those already tested. The sockets 20 may be failed sockets or end-of-lifespan sockets. For example, the unloading unit 130 may include unloading shuttles 138, an unloading buffer 134, an output module 132, and a second socket storage buffer 136.

The unloading shuttles 138 may transport the substrates 10 and the sockets 20 from the test unit 120 to the unloading unit 130, e.g., the substrates 10 may be ones already tested and the sockets 20 may be end-of-lifespan sockets. The unloading shuttles 138 may include first and second unloading shuttles 137 and 139. A robot (not shown) may transfer the substrates 10 and the sockets 20 from the unloading shuttles 138 to the unloading buffer 134.

The unloading buffer 134 may temporarily store the substrates 10 and the sockets 20. The output module 132 may provide the substrates 10 to the stackers 200. The substrates 10 may be divided into good products and failure products according to test results. The output module 132 may separate good substrates 10 from failure substrates 10, and may provide the separated substrates 10 to the stackers 200. The output module 132 may provide the sockets 20 to the second socket storage buffer 136. The sockets 20 in the second socket storage buffer 136 may be discarded.

The test unit 120 may be disposed between the loading unit 110 and the unloading unit 130. The test unit 120 may test the substrates 10. According to an example, the test unit 120 may include a printed circuit board 122, contact control modules 124, a mount guide 140, and latches 150.

The sockets 20 may be mounted on the printed circuit board 122. The substrates 10 may be mounted on the sockets 20. The substrates 10 may be connected to the printed circuit board 122 through the sockets 20. Although not illustrated in the drawing, the printed circuit board 122 may be connected to a tester. The tester may test the substrates 10.

Figure 3:
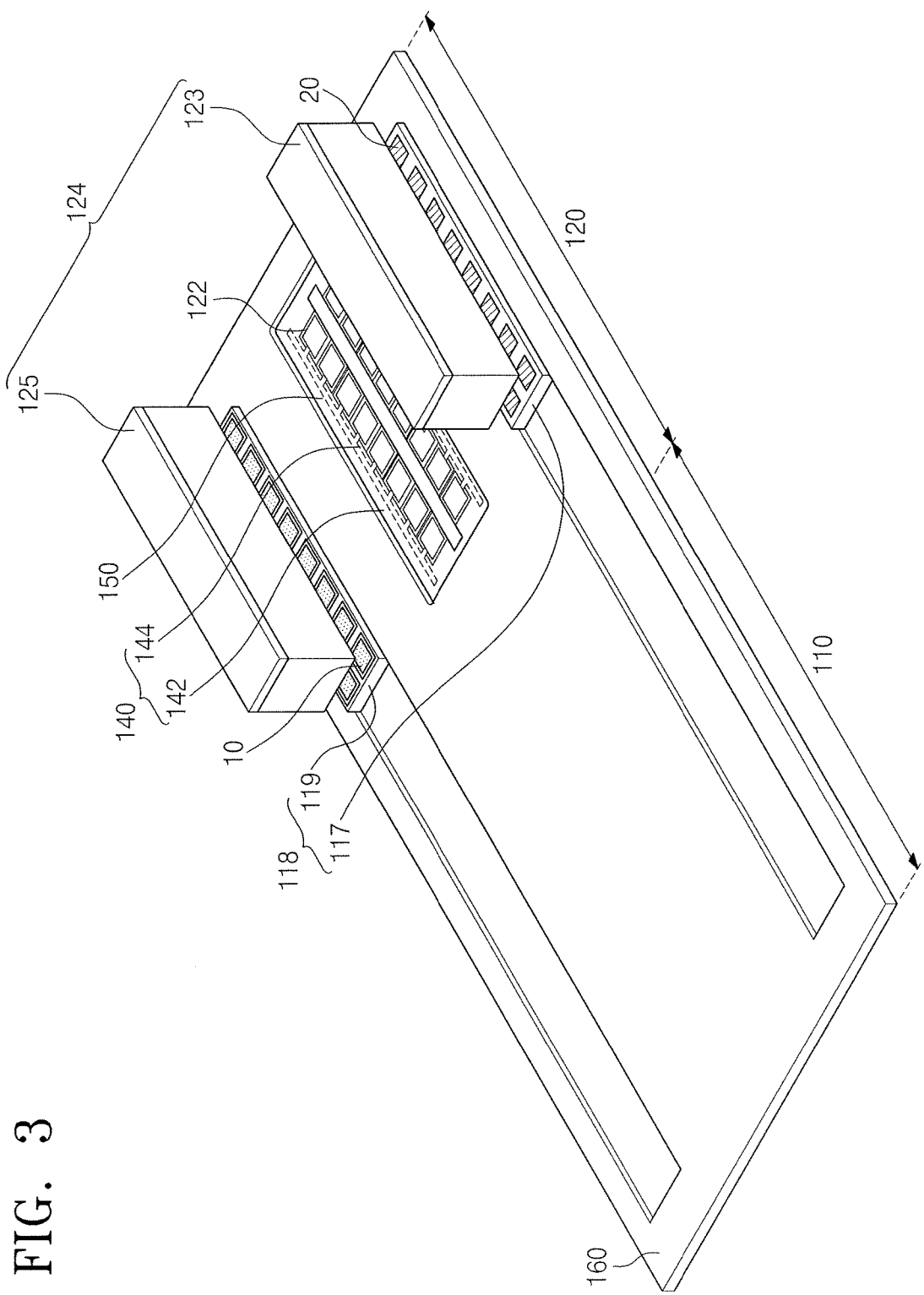
FIG. 3 illustrates a perspective view of loading shuttles and contact control modules in FIG. 1.

FIG. 3 illustrates the loading shuttles 118 and the contact control modules 124 of FIG. 1. The contact control modules 124 may move the substrates 10 and/or the sockets 20 between the loading shuttles 118 and the mount guide 140. The loading shuttles 118 may be moved to the loading unit 110 and the test unit 120 along a guide 160. The guide 160 may be extended from the loading unit 110 to the unloading unit 130. The loading shuttles 118 may provide the substrates 10 and/or the sockets 20 to the contact control modules 124. For example, the contact control modules 124 may adsorb the substrates 10 and the sockets 20 by means of vacuum. For example, the contact control modules 124 may adsorb the sockets 20 from the upper pockets 115 of the loading shuttles 118 to move them to the printed circuit board 122, followed by adsorbing the substrates 10 from the lower pockets 113 of the loading shuttles 118 to move them onto the sockets 20 on the printed circuit board 122 for testing.

According to an example, the contact control modules 124 may include first and second contact control modules 123 and 125. The first contact control module 123 may be disposed on, e.g., above, the first loading shuttle 117, so the first loading shuttle 117 may provide the substrates 10 and/or sockets 20 to the first contact control modules 123. The second contact control module 125 may be disposed on, e.g., above, the second loading shuttle 119, so the second loading shuttle 119 may provide the substrates 10 and/or sockets 20 to the second contact control modules 125.

Although not illustrated in the drawings, the contact control modules 124 may provide the substrates 10 and the sockets 20 to the unloading shuttles 138. The first and second contact control modules 123 and 125 may provide the substrates 10 and/or sockets 20 to the first unloading shuttle 137 and the second unloading shuttle 139.

The mount guide 140 may be disposed on the printed circuit board 122, and may expose a part of the printed circuit board 122. The sockets 20 and the substrates 10 may be provided on the exposed part of the printed circuit board 122, i.e., the part of the printed circuit board 122 exposed by the mount guide 140. In other words, the mount guide 140 may cover a first part of the printed circuit board 122, and may expose a second part of the printed circuit board 122 to which the substrates 10 and the sockets 20 are to be provided, e.g., the sockets 20 may be electrically connected to the exposed part of the printed circuit board 122. According to an example, the mount guide 140 may include a docking plate 142 and socket housings 144. The docking plate 142 may be disposed between the first and second contact control modules 123 and 125, e.g., the docking plate 142 may be a, e.g., continuous, frame covering the first part of the printed circuit board 122 and surrounding the second part of the printed circuit board 122 (FIG. 3). The socket housings 144 may be coupled into the docking plate 142, e.g., each socket housing 144 may surround and be fixed to a corresponding socket 20, as will be described with reference to FIGS. 4-5.

Figure 5:
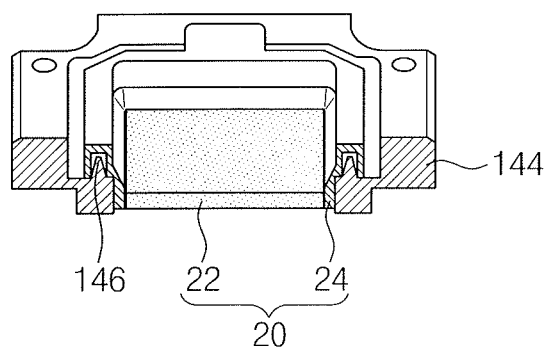

FIGS. 4 and 5 illustrate a plan view and a perspective cross-sectional view of the sockets 20 coupled into the socket housings 144 of FIG. 3.

Referring FIGS. 4 and 5, the socket 20 may be coupled into the socket housing 144. The socket housing 144 may be thicker than the socket insert 24, e.g., along a vertical direction of FIGS. 5 and 7. An edge of the socket insert 24 may be overlapped with the socket housing 144. A guide pin 146 of the socket housing 144 may be inserted into the socket insert 24 inside the socket housing 144, so the guide pin 146 may fix the socket insert 24.

Figure 6:
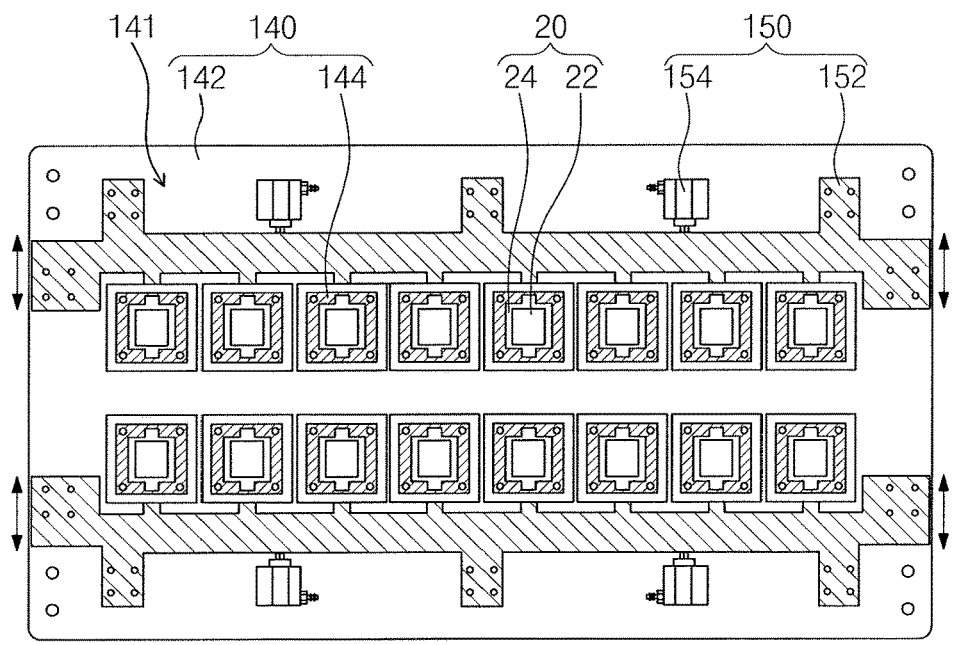
FIG. 6 illustrates a plan view of latches on a back surface of a docking plate of FIG. 3.

FIG. 6 illustrates the latches 150 on a back surface 141 of the docking plate 142 of FIG. 3. The latches 150 may be disposed on the back surface 141 of the docking plate 142, e.g., the back surface 141 of the docketing plate 142 may face away from the contact control module 124 (the latches 150 are indicated with a dashed line in FIG. 3). The latches 150 may be disposed on a first side or a second side of the socket housings 144. According to an example, the latches 150 may include latch plates 152 and cylinders 154. The latch plates 152 may be disposed in a direction of the socket housings 144 and the sockets 20 on the back surface 141 of the docking plates 142, e.g., the latch plates 152 may continuously extend along an entire row of socket housings 144. The cylinders 154 may move the latch plates 152 in a direction parallel to the docking plates 142. The latch plates 152 may be moved toward the sockets 20, e.g., along the arrows in FIG. 6. For example, as illustrated in FIG. 6, one latch plate 152 may be disposed along each row of socket housings 144, so two latch plates 152 may be at both sides of two lines of sockets 20. For example, the plurality of latch plates 152 may be coupled to the sockets 20 when the latch plates 152 are closest to the sockets 20, while the plurality of latch plates 152 may be decoupled from the sockets 20 when the latch plates 152 are farthest, e.g., moved, apart from the sockets 20.

Figure 7:
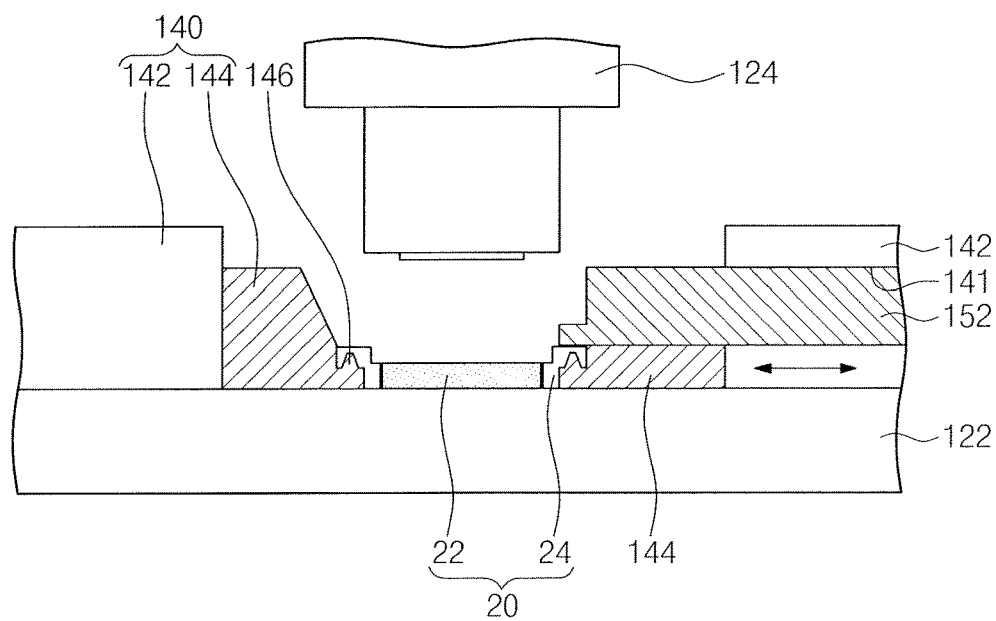
FIG. 7 illustrates a cross-sectional view of sockets and a printed circuit board.

FIG. 7 illustrates the socket 20 and the printed circuit board 122. The socket 20 may be fixed to the socket housing 144 by the latch plate 152. In detail, the socket 20 may be mounted on the printed circuit board 122 by the contact control module 124, such that the socket 20 is positioned in the socket housing 144 and contacts the printed circuit board 122 through the opening in the socket housing 144. As illustrated in FIG. 7, the socket housing 144 is connected to the docking plate 142 and the printed circuit board 122, and further is affixed to the socket 20 via the guide pin 146. The sheet socket 22 may be aligned on the printed circuit board 122 by the guide pin 146 and the socket insert 24.

Once the socket 20 is aligned and affixed by the guide pin 146, the latch plate 152 may be extended, e.g., moved, from the docking plate 142 toward the socket 20, e.g., along the arrow in FIG. 7. Once the latch plate 152 moves toward the socket 20, the latch plate 152 covers a portion of the socket housing 144 and a portion, e.g., one side of the socket insert 24, as illustrated in FIG. 7. As such, by covering the socket housing 144 and the socket insert 24, the latch plate 152 affixes the socket 20 and the socket housing 144. The latch plate 152 may be moved along the docking plate 142, e.g., along the arrow in FIG. 7. Although not illustrated in the drawing, when the latch plate 152 deviates from the upper surface of the socket 20, e.g., when the latch plate 152 moves away (to the right in FIG. 7) from the upper surface of the socket 20, the contact control module 124 may replace the socket 20. The sockets 20 may be automatically replaced. For example, the plurality of latch plates 152 may be coupled to the sockets 20 when the latch plates 152 overlap and cover, e.g., at least partially, the socket housing 144 and the socket insert 24, while the plurality of latch plates 152 may be decoupled from the sockets 20 when the latch plates 152 move sufficiently away from the sockets 20.

Figure 8:
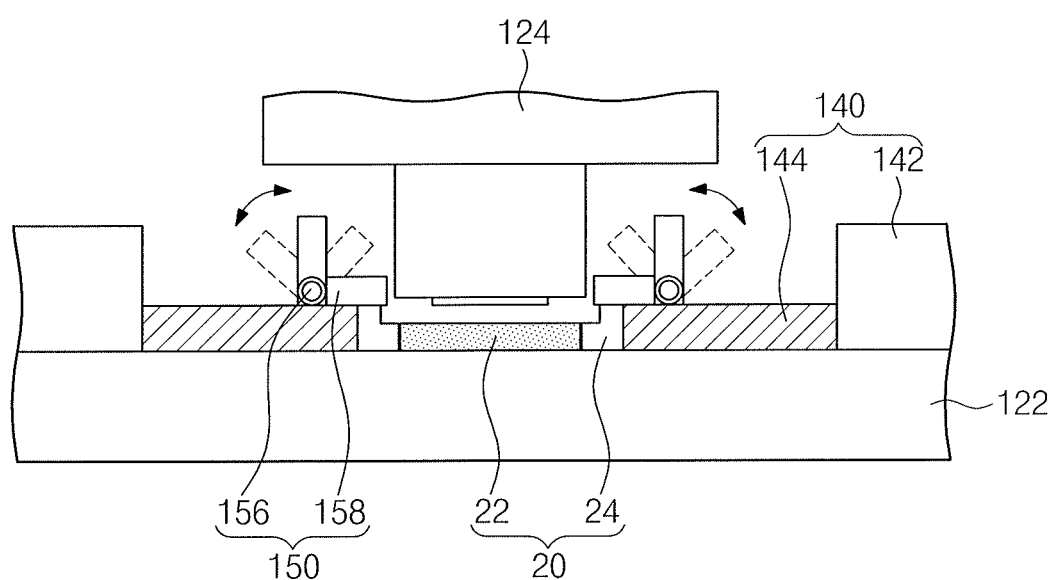
FIG. 8 illustrates a cross-sectional view of a latch according to an example embodiment.

FIG. 8 illustrates the latch 150 according to example embodiment. The latch 150 may fix both sides of the socket 20. According to an example, the latch 150 may include shafts 156 and latch pins 158. The shafts 156 may be disposed on both edges of the socket 20. The shafts 156 may rotate in opposite directions to each other at the time of replacement of the socket 20. The latch pins 158 may rotate along the shafts 156. The latch pins 158 may be disposed on both edges of the socket 20. The latch pins 158 may fix the socket 20 on the printed circuit board 122. On the other hand, the latch pins 158 may be rotated towards outer sides of the socket 20. The contact control module 124 may replace the socket 20.

Figure 9:
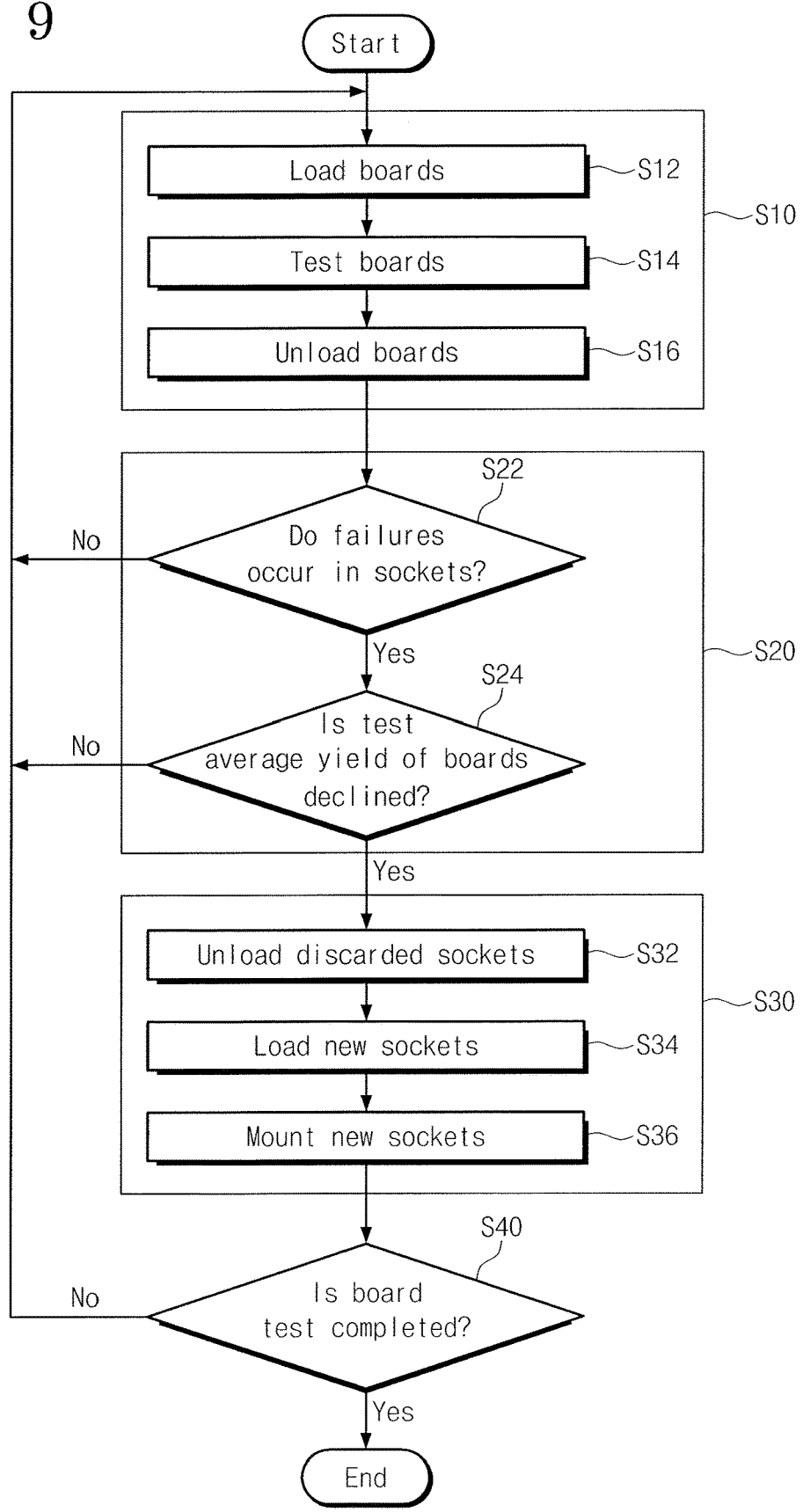
FIG. 9 illustrates a flowchart of a management method of a handler according to an embodiment.

Hereinafter, a description of a management method of the handler 100 having the above-described configuration according to an embodiment will be provided with reference to FIG. 9. FIG. 9 illustrates a flowchart of a management method of the handler 100.

First, referring to FIG. 9, the substrates 10 are tested (operation S10). According to an example, the test operation (S10) of the substrates 10 may include a loading operation (S12) of the substrates 10, a test performing operation (S14), and an unloading operation (S16).

The loading operation (S12) of the substrates 10 is an operation of mounting the substrates 10 on the sockets 20 of the test unit 120. The substrates 10 may be provided to the test unit 120 through the loading unit 110.

The test performing operation (S14) is an operation of electrically testing the substrates 10. The substrates 10 may be tested in a range of low temperature, e.g., about (−20°) C., to high temperature, e.g., about 120° C. The substrates 10 may be divided into good products and failure products according to the test results.

The unloading operation (S16) of the substrates 10 is an operation of unloading the substrates 10 from the test unit 120. The unloading unit 130 may provide the substrates 10 to the stackers 200 according to the test results.

Next, it is determined whether to temporarily stop the test of the substrates 10 (operation S20). The test of the substrates 10 may be temporarily stopped when the sockets 20 show failure. When the sockets 20 are normal, i.e., no failure, the test of the substrates 10 may be repetitively performed. The temporary test stopping operation (S20) may include failure checking operation (S22) of the sockets 20 and a test average yield decline checking operation (S24) of the substrates 10.

The failure checking operation (S22) of the sockets 20 is an operation of detecting contact failures or short circuits of the substrates 10 and the sockets 20. When the substrates 10 and the sockets 20 are not connected or abnormally connected, a control unit (not shown) may determine that the sockets 20 have failures. Checking contact failures or short circuits of the substrates 10 and the sockets 20 may be based on classification from the test failure of the substrates 10.

The test average yield decline checking operation (S24) is an operation of checking whether the average yield of the tested substrates 10 has declined. Every time the substrates 10 are tested, the test average yield may be monitored in real time in the handler 100 or a production line. The average yield decline may occur due to the test failures of the substrates 10. When the test failures of the substrates 10 are frequent, the average yield is lowered. When the yield of the substrates 10 is average or lower, the control unit (not shown) may determine to replace the sockets 20. The failure checking operation (S22) and the average yield decline checking operation (S24) may extend the cumulative use time of the sockets 20. When failures of the sockets 20 do not occur or the average yield of the substrates 10 is not changed, the substrates 10 are tested without replacement of the sockets 20. The lifespan of the sockets 20 may be increased when the sockets 20 are periodically replaced.

Next, the sockets 20 are replaced (operation S30). The socket replacing operation (S30) may include an operation (S32) of unloading discarded. e.g., failed, sockets 20, an operation (S34) of loading new sockets 20, and an operation (S36) of mounting the new sockets 20.

The unloading operation (S32) of the discarded sockets 20 is an operation of removing the discarded sockets 20 from the test unit 120. The latches 150 may be separated from the discarded sockets 20, and the contact control modules 124 may adsorb the discarded sockets 20 from the docket plate 142 and provide the discarded sockets 20 to the unloading shuttles 138. The discarded sockets 20 may be provided into the second socket storage buffer 136 through the output module 132.

The loading operation (S34) of the new sockets 20 is an operation of providing new sockets 20 to the test unit 120 from the loading unit 110. The loading unit 110 may provide the new sockets 20 to the test unit 120.

The mounting operation (S36) of the new sockets 20 is an operation of fixing the new sockets 20 to the printed circuit board 122. The contact control modules 124 may provide the new sockets 20 onto the printed circuit board 122 inside the socket housings 144. The latches 150 may be provided at edges of the sockets 20. The sockets 20 may be fixed by the latches 150.

Finally, the control unit determines whether to permanently end the test for the substrates 10 (operation S40). When the test for the substrates 10 is not complete, the control unit may perform operations 10 to 40 iteratively.

By way of summary and review, a handler may include sockets between a semiconductor device, e.g., a substrate, and a printed circuit board to connect therebetween. The lifespan of the sockets may be predetermined according to a certain test process times, i.e., periodically replaced, or based on performance, i.e., replaced every time a failure occurs. However, as the sockets are mounted on the printed circuit board, conventional sockets are replaced manually.

In contrast, the handler 100, according to an embodiment, includes latches 150 to fix the sockets 20 onto the printed circuit board 122. As such, the sockets 20 may be automatically moved and replaced when separated from the latches 150 by a same method used to move and replace the substrates 10 in the loading and unloading units.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A handler, comprising:
    a loading unit to transport sockets;
    a test unit including:
        a printed circuit board, the sockets to be mounted on and electrically connected to the printed circuit board,
        contact control modules above the printed circuit board and replacing the sockets,
        latches between the printed circuit board and the contact control modules to fix the sockets to the printed circuit board, and
        a mount guide including:
            a docking plate on the printed circuit board, the docking plate exposing a part of the printed circuit board, and
            socket housings in the docking plate, the socket housings to fix the sockets, the latches being on the socket housings; and
    an unloading unit to unload the sockets from the test unit.

2. The handler as claimed in claim 1, wherein the latches include:
    latch plates extended from the docking plate toward the sockets inside the socket housings; and
    cylinders to move the latch plates from outside of the sockets toward a top portion of the sockets along the docking plate.

3. The handler as claimed in claim 2, wherein the sockets include:
    sheet sockets connected to the printed circuit board; and
    socket inserts surrounding the sheet sockets, guide pins of the socket housings being inserted into edges of the socket inserts to align the sheet sockets on the printed circuit board.

4. The handler as claimed in claim 1, wherein, when the latches fix the sockets to the printed circuit board, the latches overlap edges of the sockets, such that the edges of the sockets are between the latches and the printed circuit board.

5. The handler as claimed in claim 2, wherein the latch plates are on two sides of the socket housings, respectively, the latch plates being coupled to the sockets when coming close to each other, and decoupled from the sockets when going away from each other.

6. The handler as claimed in claim 1, wherein the latches include:
    shafts on the socket housings; and
    latch pins rotated from the socket housings toward the sockets along the shafts to fix the sockets.

7. The handler as claimed in claim 1, wherein the loading unit and the unloading unit include shuttles to transport the sockets, the shuttles including double pockets.

8. The handler as claimed in claim 7, wherein the double pockets include:
    lower pockets in which substrates are to be mounted; and
    upper pockets wider than the lower pockets, the sockets to be mounted in the upper pockets.

9. The handler as claimed in claim 1, wherein the contact control modules deliver the sockets between shuttles and the printed circuit board.

10. The handler as claimed in claim 1, wherein each of the loading unit and the unloading unit includes first and second socket storage buffers to store the sockets, the first socket storage buffer to store new sockets and the second socket storage buffer to store discarded sockets.

11. A handler, comprising:
    a loading unit to transport sockets;
    a test unit including:
        a printed circuit board, the sockets to be mounted on and electrically connected to the printed circuit board,
        contact control modules above the printed circuit board and replacing the sockets,
        latches between the printed circuit board and the contact control modules, the latches being movable on the printed circuit board toward the sockets to detachably affix the sockets to the printed circuit board, and
        a mount guide including:
            a docking plate on the printed circuit board, the docking plate exposing a part of the printed circuit board, and
            socket housings in the docking plate, the socket housings to fix the sockets, the latches being on the socket housings; and
    an unloading unit to unload the sockets from the test unit.

12. The handler as claimed in claim 11, wherein the latches are movable to partially cover edges of the sockets to affix the sockets to the printed circuit board.

13. The handler as claimed in claim 11, wherein the latches are movable toward the socket housings to extend beyond edges of the socket housings.

14. The handler as claimed in claim 13, wherein the latches include:
    latch plates linearly extended along a first direction parallel to a row of the socket housings, the latch plates being movable along a second direction toward the row of the socket housings; and
    cylinders to move the latch plates along the second direction, the second direction being perpendicular to the first direction.

15. The handler as claimed in claim 13, wherein the latches are movable toward the socket housings to partially cover openings in respective socket housings, the openings accommodating the sockets.

* * * * *